United States Patent
Ku et al.

(10) Patent No.: US 9,835,651 B2
(45) Date of Patent: Dec. 5, 2017

(54) CANTILEVER TYPE PROBE CARD FOR HIGH FREQUENCY SIGNAL TRANSMISSION

(71) Applicant: MPI CORPORATION, Zhubei (TW)

(72) Inventors: Wei-Cheng Ku, Zhubei (TW); Hao Wei, Zhubei (TW); Jun-Liang Lai, Zhubei (TW); Chih-Hao Ho, Zhubei (TW)

(73) Assignee: MPI CORPORATION, Zhubei (TW)

( * ) Notice: Subject to any disclaimer, the term of this patent is extended or adjusted under 35 U.S.C. 154(b) by 123 days.

(21) Appl. No.: 14/619,597

(22) Filed: Feb. 11, 2015

(65) Prior Publication Data
US 2016/0139179 A1    May 19, 2016

(30) Foreign Application Priority Data
Nov. 14, 2014 (TW) .............................. 103139610 A (51) Int. Cl.
G01R 1/067 (2006.01)
(52) U.S. Cl.
CPC ..... G01R 1/06727 (2013.01); G01R 1/06772 (2013.01)
(58) Field of Classification Search
CPC ............ G01R 1/06727; G01R 31/2886; G01R 1/07314
USPC ............ 324/750.25, 755.07, 756.06, 756.03, 324/756.05, 755.01
See application file for complete search history.

(56) References Cited

U.S. PATENT DOCUMENTS

| 2008/0007278 A1* | 1/2008 | Ku ..................... | G01R 31/2889 324/756.03 |
| 2009/0153164 A1* | 6/2009 | Tan .................... | G01R 1/07342 324/754.08 |
| 2012/0242360 A1* | 9/2012 | Huang ............... | G01R 1/06772 324/754.03 |

FOREIGN PATENT DOCUMENTS

CN    101236215    8/2008

OTHER PUBLICATIONS

Taiwanese Examination Report, 103139610, 5 pages.
Taiwanese Search Report, 103139610, 1 page.

* cited by examiner

*Primary Examiner* — Billy Lactaoen
(74) *Attorney, Agent, or Firm* — Lynette Wylie; Apex Juris, PLLC (57) ABSTRACT

A high-frequency cantilever type probe card includes a base board, a probe base provided on the base board, two probes, and a capacitor having opposite ends electrically connected to the probes respectively. The probe base is made of an insulating material, and the probes are made of a conductive material. Each of the probes has an arm and a tip, wherein the arm is connected to the probe base, and the tip is adapted to contact a pad of a DUT. When the DUT generates a testing signal with a high frequency, and the testing signal is transmitted to one of the probes, the capacitor, and the other one of the probes in sequence, and then transmitted back to the DUT.

14 Claims, 7 Drawing Sheets

CANTILEVER TYPE PROBE CARD FOR HIGH FREQUENCY SIGNAL TRANSMISSION

BACKGROUND OF THE INVENTION

1. Technical Field

The present invention relates generally to a probe card for testing circuit, and more particularly to a high-frequency cantilever type probe card.

2. Description of Related Art

Typically, probe cards are widely used in the test of the electrical connection between the electronic devices. Cantilever type probe card is a popular transmission interface between a tester and a device under test (DUT).

The conventional cantilever type probe card includes probes electrically connected to a rigid multilayer printed circuit board. The probes contact pads of the DUT with tips thereof, and the multilayer printed circuit board is electrically connected to terminals of the tester. The printed circuit board is provided with vias for the connection of the circuits on different layers. However, there will be a via stub effect occurred in the vias. Via stub effect is an inductance generated in the vias while high-frequency signals are transmitted through the printed circuit board, and the inductance is high while the frequency of the signals is high. The inductance in the vias provides the high-frequency signals a resistance, which makes the test imprecise.

On the other hand, the conventional tester can't provide the testing signals with high frequency, which match the present electronic devices with high calculation speed and high throughput. A conventional way to fix this problem is that the high-frequency testing signals are generated by the DUT, and the high-frequency testing signals transmitted to the probe card, and then transmitted back to the DUT to form a loop. it is called a self-testing procedure. The multilayer printed circuit board of the probe card is provided with a feedback element, and the feedback element usually is provided on an outer surface toward the tester of the multilayer printed circuit board. Therefore, the testing signals generated by the DUT have to be transmitted for a long path, which increases the risk of the testing signals being interfered by other elements of the multilayer printed circuit board, and increases the inductance of the circuit. While the frequency of the testing signals is high, the above problem is bigger. It still makes the test imprecise.

BRIEF SUMMARY OF THE INVENTION

In view of the above, the primary objective of the present invention is to provide a high-frequency cantilever type probe card, which is able to efficiently transmit the high-frequency testing signals, and able to automatically switch the signal paths according to the frequency of the testing signals.

The present invention provides a high-frequency cantilever type probe card, which is placed above a DUT, including a base board, a probe base provided on the base board, two probes, and a capacitor having opposite ends electrically connected to the probes respectively. The probe base is made of an insulating material, and the probes are made of a conductive material. Each of the probes has an arm and a tip, wherein the arm is connected to the probe base, and the tip is adapted to contact a pad of a DUT.

When the DUT generates a testing signal with a high frequency, and the testing signal is transmitted to one of the probes, the capacitor, and the other one of the probes in sequence, and then transmitted back to the DUT.

In an embodiment, the high-frequency cantilever type probe card further includes two inductive elements, each of which has opposite ends electrically connected to one of the probes and a tester. When the tester generates a testing signal with a low frequency or a DC testing signal, the testing signal is transmitted to the DUT through one of the inductive elements and one of the probes, and then the testing signal is transmitted back to the tester through the other one of the probes and the other one of the inductive elements.

Whereby, with the aforementioned design, the high-frequency cantilever type probe of the present invention is able to efficiently transmit the high-frequency testing signals, and able to automatically switch the signal paths according to the frequency of the testing signals.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

Figure 1:
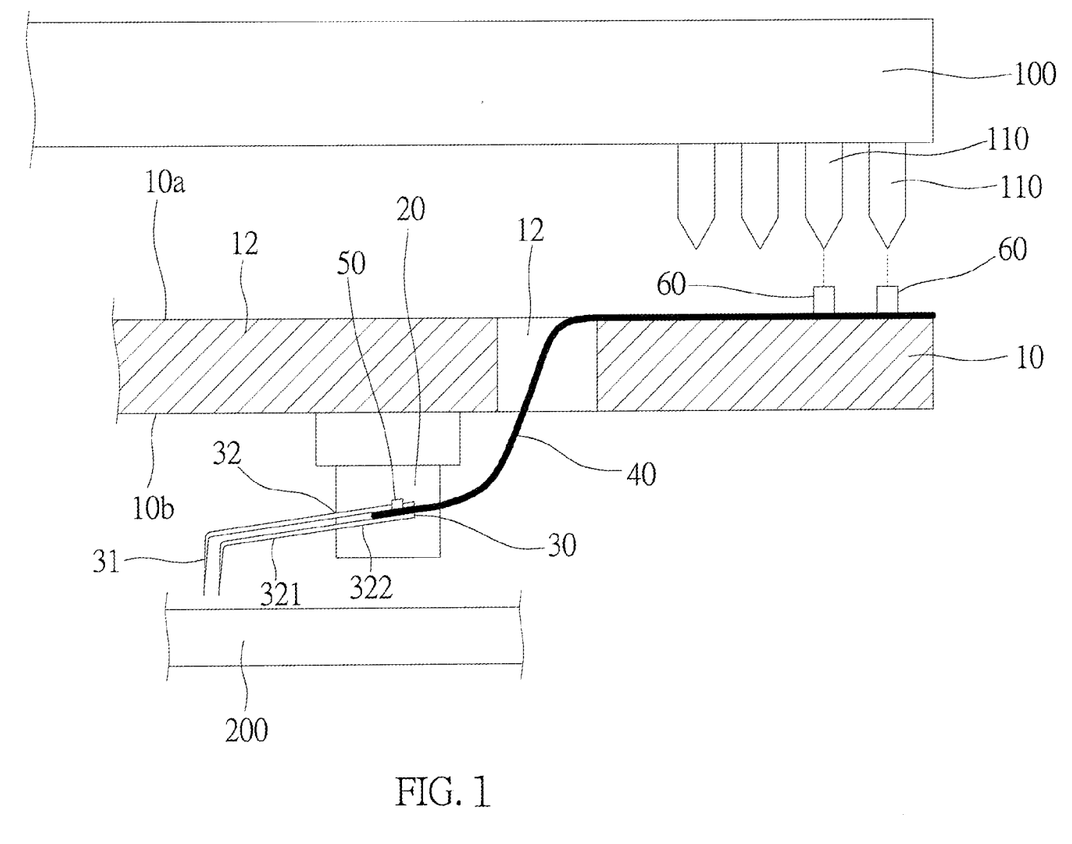
FIG. 1 is a sectional view of a first preferred embodiment of the present invention.

As shown in FIG. 1, a high-frequency cantilever type probe card of the first preferred embodiment of the present invention, which is provided between a tester 100 and a device under test (DUT) 200 for signal transmission therebetween, includes a base board 10, a probe base 20, two probes 30, a signal transmission device 40, a capacitor 50, and two inductive elements 60.

The base board 10 is a rigid printed circuit board having a circuit (not shown). The base board 10 has a first side 10a toward the tester 100 and a second side 10b toward the DUT 200. The base board 10 is provided with a through hole 12, which is opened at both the first and the second sides 10a, 10b.

The probe base 20 is mounted on the second side 10b of the base board 10 beside the through hole 12. The probe base 20 is made of epoxy, which is insulating and capable of absorbing vibration. In another embodiment, the probe base 20 is made of an insulating material other than epoxy.

The probes 30 are made of a conductive material, and each has a tip 31 and an arm 32. The tip 31 is designated to contact a pad (not shown) of the DUT 200. The arm 32 has a first section 321 and a second section 322, wherein the first section 321 is connected to the tip 31. The second section 322 is embedded in the probe base 20, and both the tip 31 and the first section 321 are left out of opposite sides of the probe base 20.

The signal transmission device 40 is flexible, and it is a flexible printed circuit board having a plurality of transmission circuits (not shown) in the present embodiment. The signal transmission device 40 has a middle portion received in the through hole 12 of the base board 10, and the rest portion extending out of the through hole 12 at the first and the second sides 10a, 10b. The portion of the signal transmission device 40 at the second side 10b of the base board 10 is embedded in the probe base 20, and the transmission circuits are electrically connected to the second sections 322 of the arms 32 of the probes 30 respectively.

The capacitor 50 is mounted on the signal transmission device 40, and has opposite ends electrically connected to two of the transmission circuits respectively. The capacitor 50 is embedded in the probe base 20 as well to have a high firmness and durability with the probe base 20.

The inductive elements 60 are mounted on the signal transmission device 40 beyond the first side 10a of the base board 10, and have opposite ends connected to two of the transmission circuits of the signal transmission device 40 and the tester 100 respectively. Therefore, the probes 30 are electrically connected to the tester 100 through the transmission circuits and the inductive elements 60. In the present embodiment, the inductive elements 60 are chokes, and in another embodiment, the inductive elements 60 could be coils, windings, beads, or other inductive elements. The advantage of choke is that it has small size to be mounted on the base board 10 without having to worry about the size problem, so that the probe card could be thinner.

Figure 2:
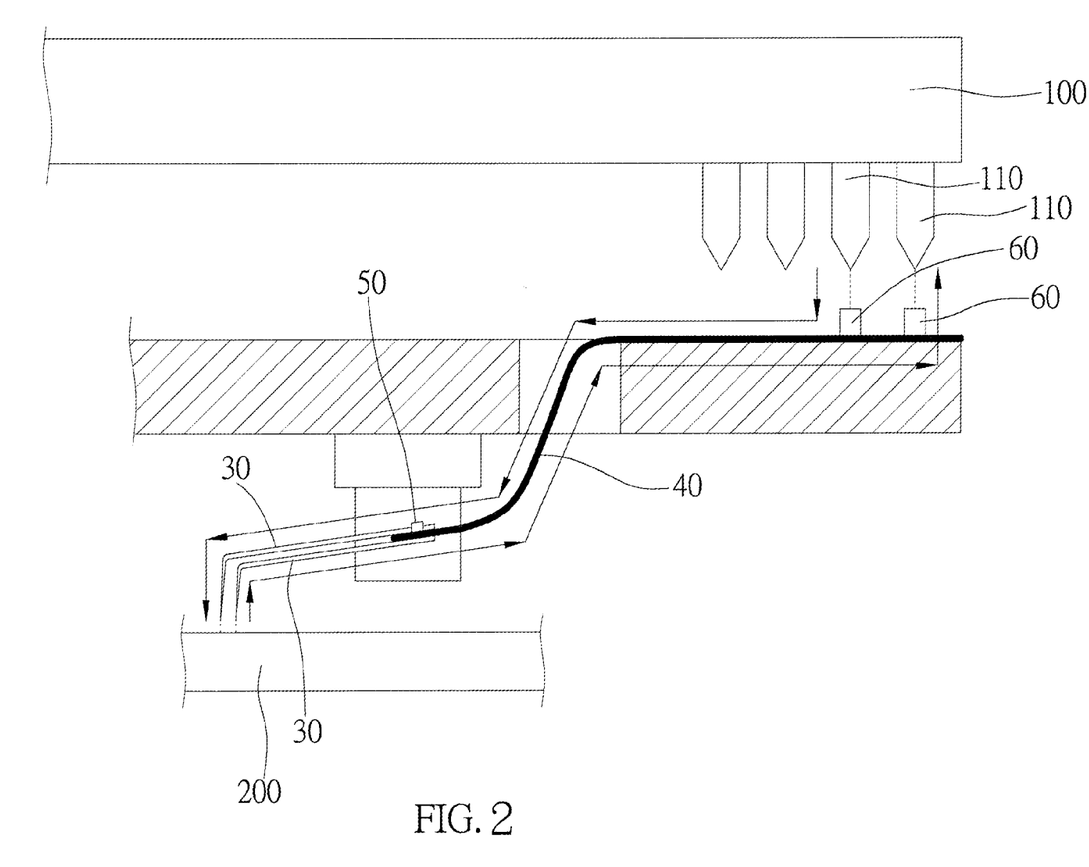
FIG. 2 is a sectional view of the first preferred embodiment of the present invention, showing the signal path of the low-frequency testing signals.

Since the inductive elements 60 are switched to short circuits, and the capacitor is switched to an open circuit (or has a high resistance) for a testing signal with low frequency or a DC testing signal, as shown in FIG. 2, when the tester 100 generates a low-frequency or DC testing signal, the testing signal is transmitted to the DUT 200 through the inductive element 60, the signal transmission device 40, and one of the probes 30, and then the testing signal is transmitted back to the tester 100 from the DUT 200 through the other probe 30, the signal transmission device 40, and the other inductive element 60 for testing the electrical connection in the DUT 200.

Figure 3:
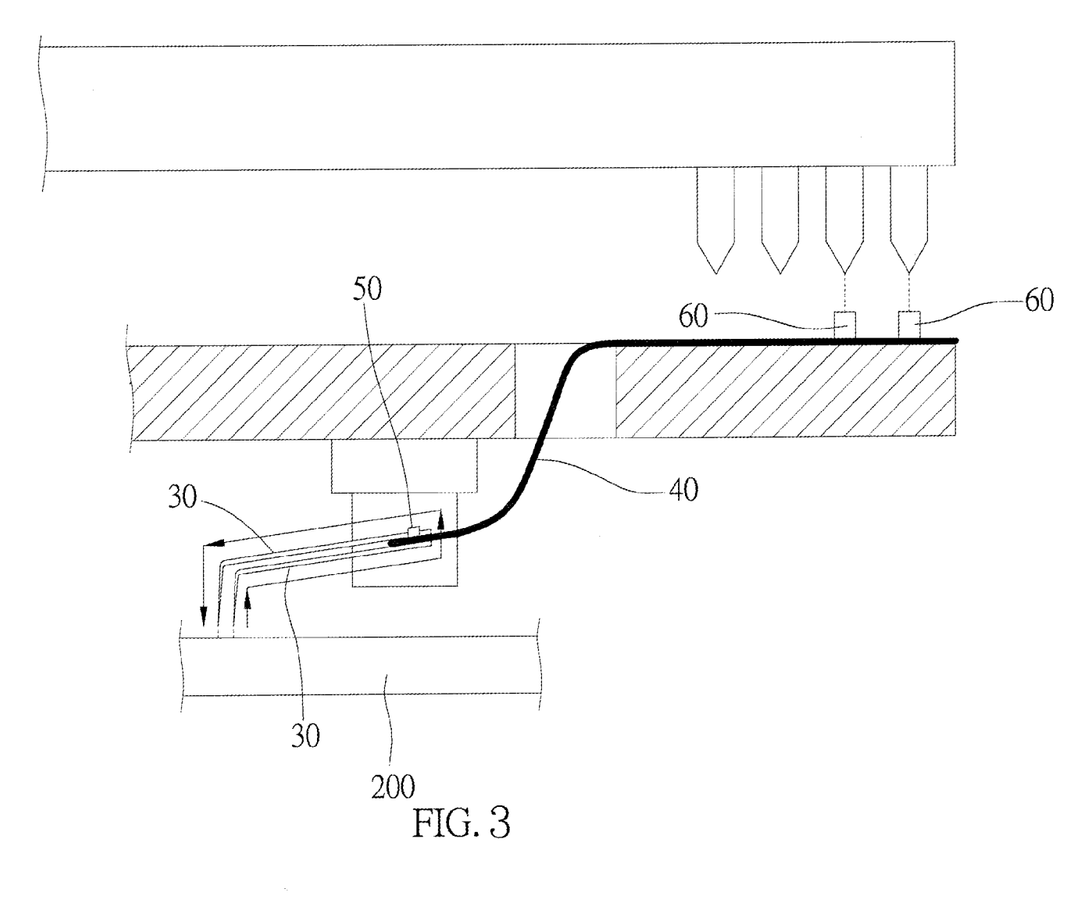
FIG. 3 is a sectional view of the first preferred embodiment of the present invention, showing the signal path of the low-frequency testing signals.

When the testing signal has a high frequency, such as 12 Gbps, the inductive elements 60 are switched to open circuits (or have high resistances), and the capacitor is switched into a short circuit. FIG. 3 shows a self-testing procedure, in which the DUT 200 generates a high-frequency testing signal, the testing signal is transmitted to one of the probes 30, the signal transmission device 40, and the other probe 300 in sequence, and then the testing signal is transmitted back to the DUT 200. It is easy to understand that it has a short transmission path for the testing signal in the self-testing procedure.

Figure 4:
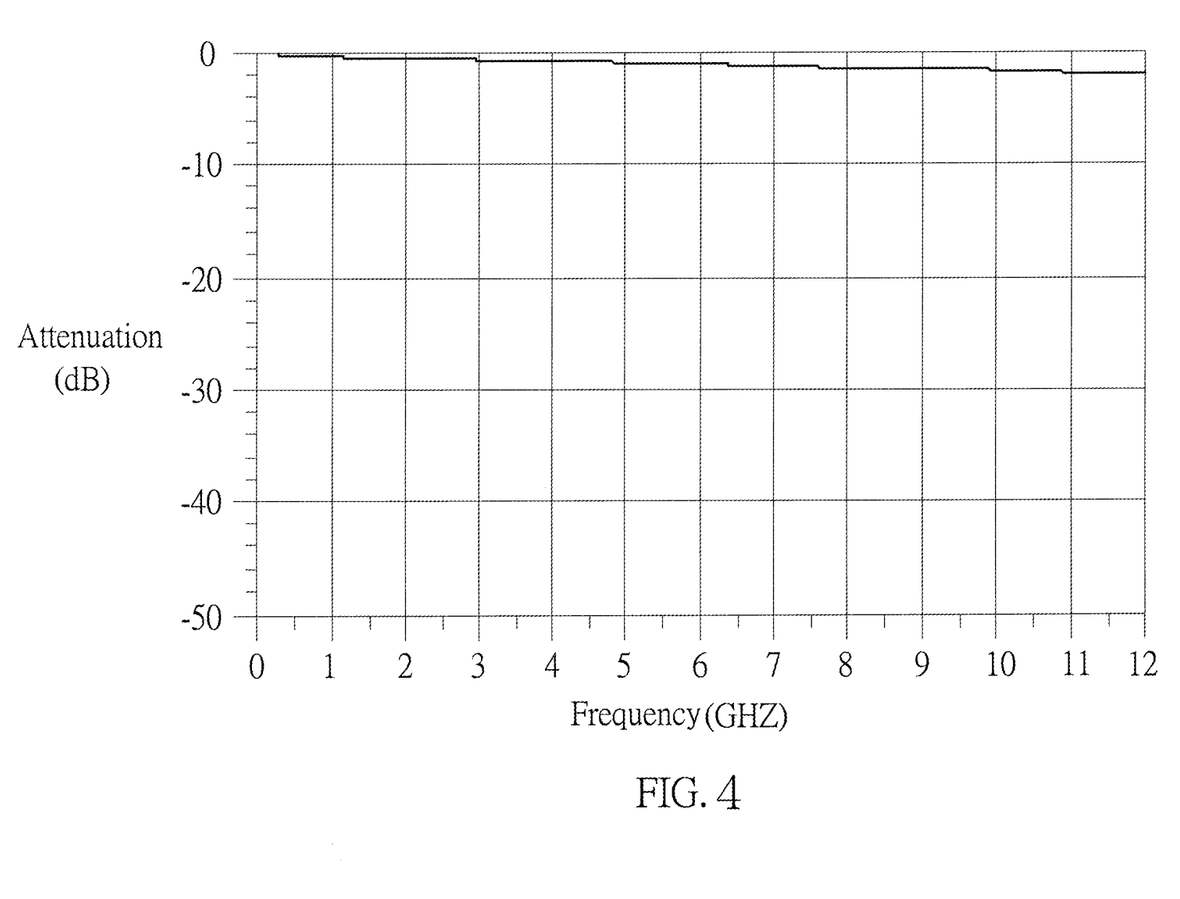
FIG. 4 is a diagram of the first preferred embodiment of the present invention, showing the signal attenuation in transmission.

As a result, the probe card of the present invention may avoid the electrical interference problem as well as the via stub effect, and furthermore, it has a short transmission path for the testing signal in the self-testing procedure to reduce the resistance and the inductance on the transmission path. FIG. 4 shows that the probe card of the present invention has a low signal attenuation in transmission (2 dB for transmission of 12 Gbps testing signal). It will get a precise test for the high-frequency testing signal.

Figure 5:
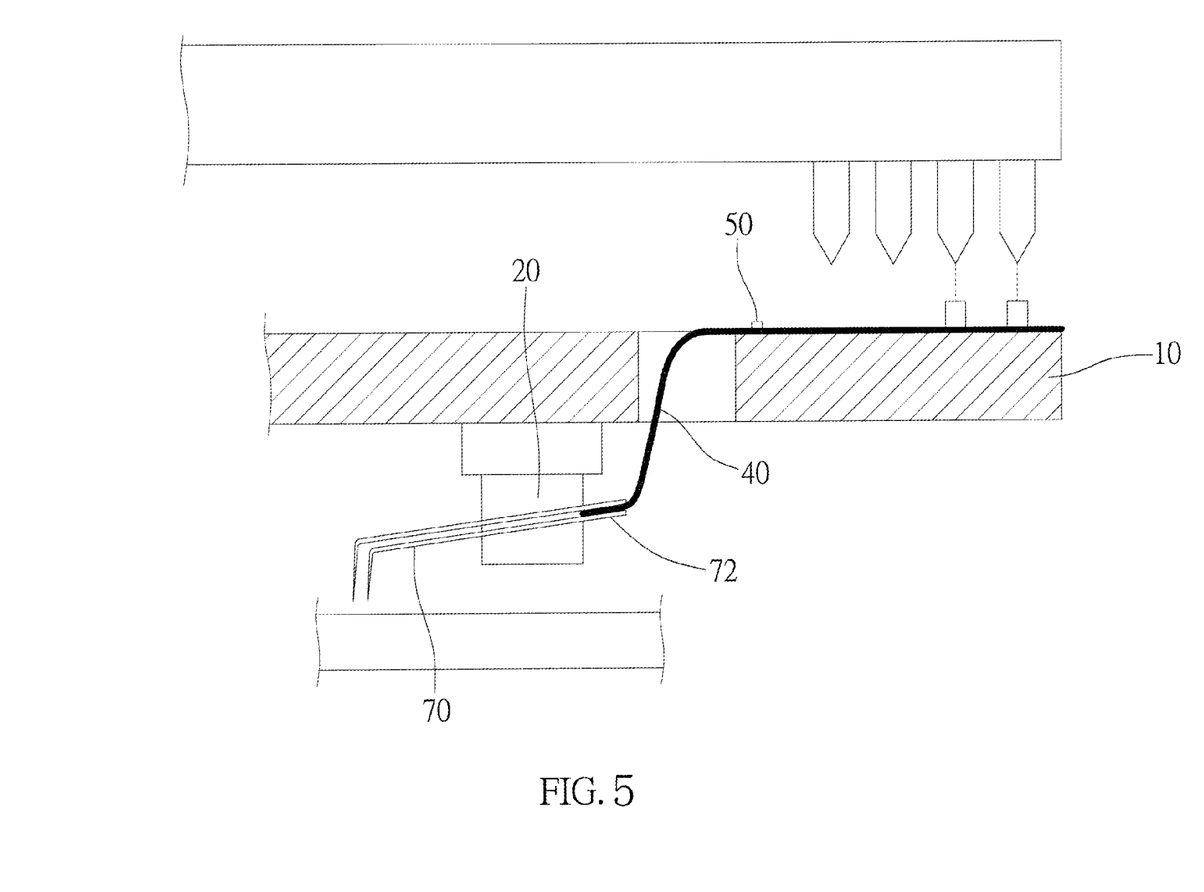
FIG. 5 is a sectional view of a second preferred embodiment of the present invention.

FIG. 5 shows a high-frequency cantilever type probe card of the second preferred embodiment of the present invention, which is similar to the first preferred embodiment, except that a probe 70 has a longer arm 72, which extends out of the probe base 20 to be connected to the signal transmission device 40. The capacitor 50 is provided on the base board 10. The second preferred embodiment provides an easy way to assemble and disassemble the signal transmission device 40 and the capacitor 50 when they are malfunctioned. It could increase the efficiency of repair and assembly.

Figure 6:
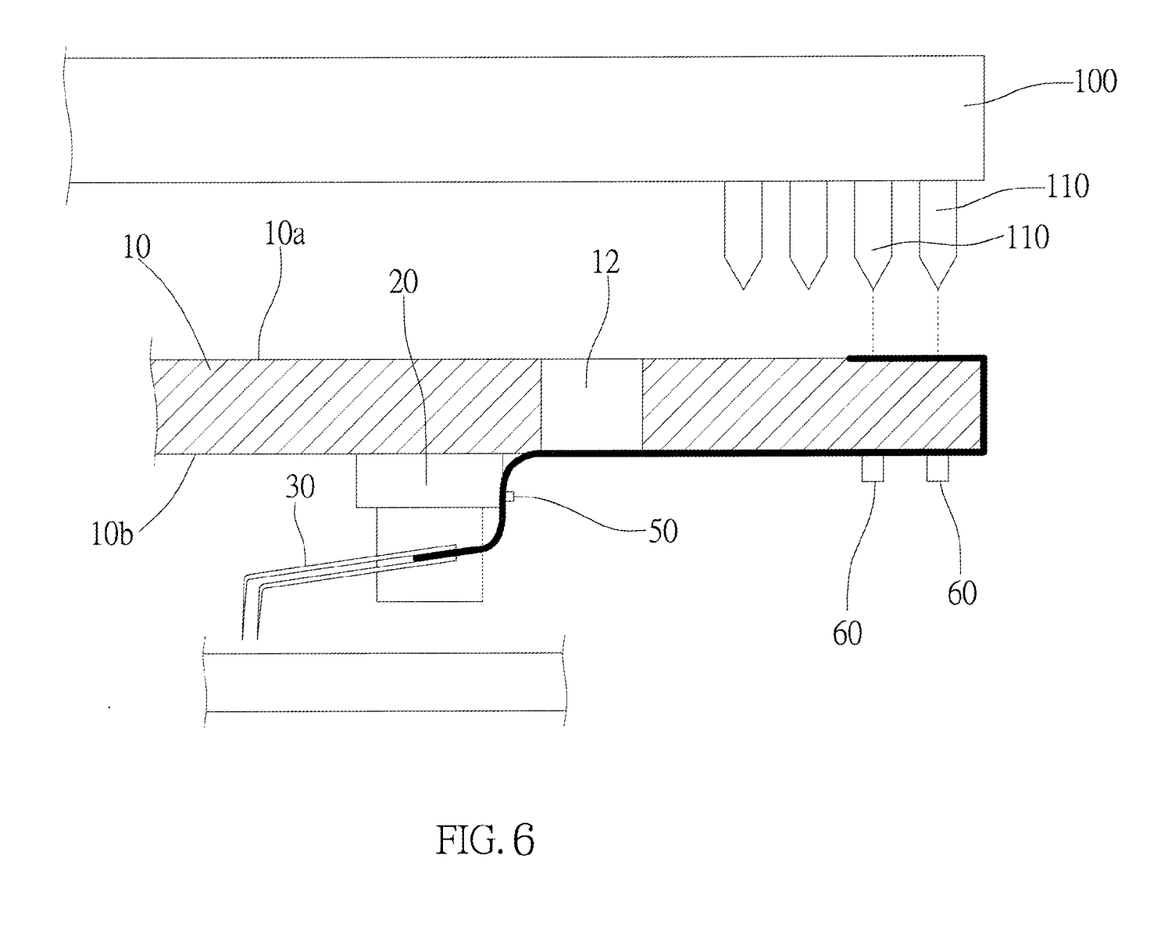
FIG. 6 is a sectional view of a third preferred embodiment of the present invention.

FIG. 6 shows a high-frequency cantilever type probe card of the third preferred embodiment of the present invention, which is similar to the above preferred embodiments, except that the signal transmission device 40 runs around the base board 10 rather than passing through the through hole 12. Precisely, the signal transmission device 40 is attached to the first side 10a, and extends to the second side 10b (attached to the second side 10b too), through an edge of the base board 10 to be attached to the probe base 20 on the second side 10b. As a result, the signal transmission device 40 is electrically connected to the probes 30. This design could avoid the via stub effect as well. Besides, the capacitor 50 is mounted on a portion of the signal transmission device 40 at a position which is attached to the probe base 20, that the capacitor 50 is firmly fixed with the probe base 20 to increase the durability of the entire high-frequency cantilever type probe card, as well as to provide an easy way to assemble and disassemble the capacitor 50. In another embodiment, the signal transmission device 40 is provided on the second side 10b of the base board 10, and electrically connected to the probes 30 and terminals 110 of the tester 100 through the transmission circuits of the signal transmission device 40. The signal transmission device 40 on the second side 10b of the base board 10 could reduce the thickness of the elements on the first side 10a, and does not interfere the elements on the second side 10b, such as the probe base 10 and the probes 30, that could reduce the total thickness of the probe card.

Figure 7:
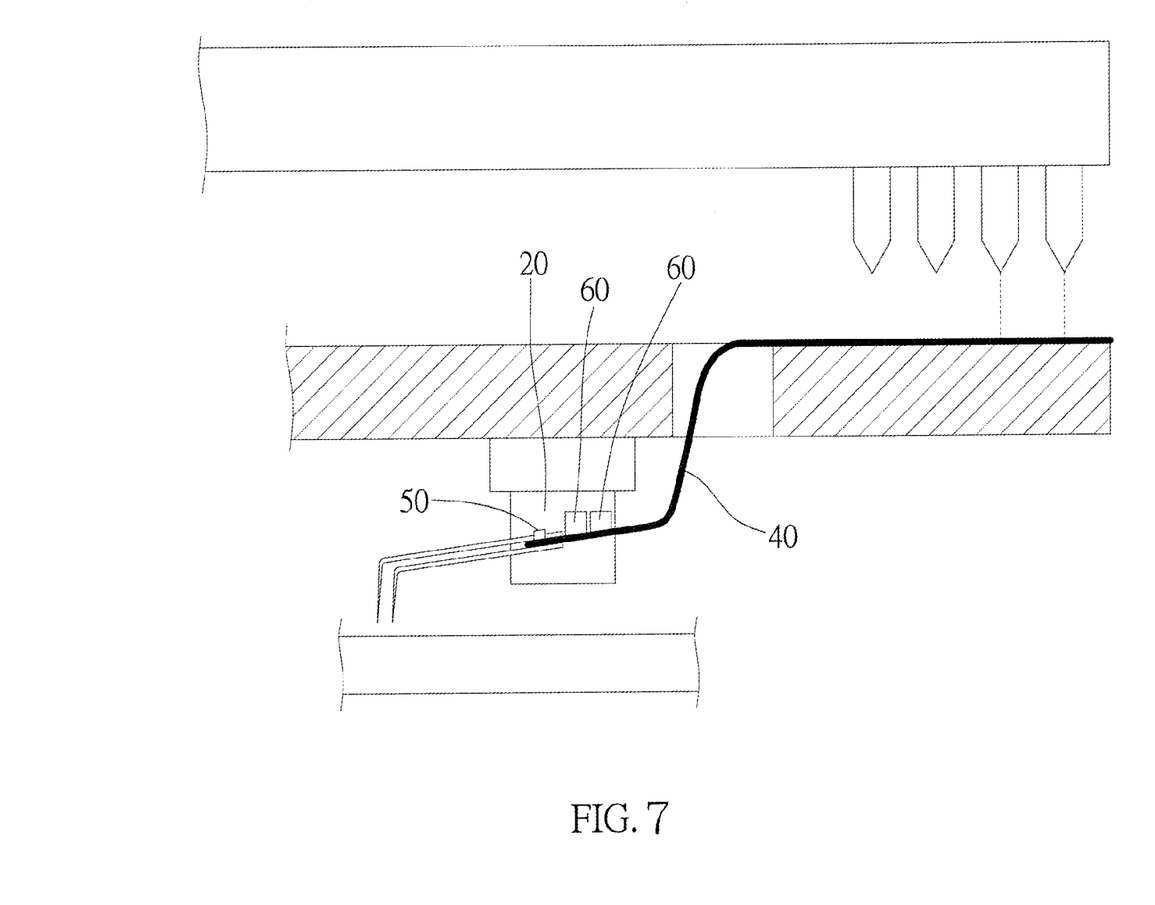
FIG. 7 is a sectional view of a fourth preferred embodiment of the present invention.

FIG. 7 shows a high-frequency cantilever type probe card of the fourth preferred embodiment of the present invention, which is similar to the third preferred embodiment, except that the capacitor 50 and the inductive elements 60 are mounted on the signal transmission device 40, and then the capacitor 50, the inductive elements 60, and a portion of the signal transmission device 40, on which the capacitor 50 and the inductive elements 60 are mounted, are embedded in the probe base 20. This design could efficiently shorten the transmission path of the testing signal in the self-testing procedure, and reduce the resistance and the inductance on the transmission path. Furthermore, it could isolate the probe base to avoid the noise from the environment to get a precise test.

It must be pointed out that the embodiments described above are only some preferred embodiments of the present invention. For example, the signal transmission device 40 could be coaxial cables, each of which has a core to be the transmission circuit, rather than the flexible printed circuit board as described in the embodiments. The signal transmission device 40 also could be a wire having a plurality of signal lines and grounding lines. A ratio of the number of the signal lines and the grounding lines could be in a range between 60:40 and 40:60, and a preferred range is 50:50. The resistance could be reduced by connecting the twisted pairs parallel. All equivalent structures which employ the concepts disclosed in this specification and the appended claims should fall within the scope of the present invention.

What is claimed is:

1. A high-frequency cantilever type probe card, which is placed above a DUT, comprising:
   a base board;
   a probe base provided on the base board, wherein the probe base is made of an insulating material;
   two probes, which are made of a conductive material, each having an arm and a tip, wherein the arm is connected to the probe base, and the tip is adapted to contact a pad of a DUT; and
   a capacitor having opposite ends electrically connected to the probes respectively, wherein when the DUT generates a testing signal with a high frequency, and the testing signal is transmitted to one of the probes, the capacitor, and the other one of the probes in sequence, and then the testing signal is transmitted back to the DUT;
   wherein the high-frequency cantilever type probe card further comprises two inductive elements, each of which has opposite ends electrically connected to one of the probes and a tester, wherein when the tester generates a testing signal with a low frequency or a DC testing signal, the testing signal is transmitted to the DUT through one of the inductive elements and one of the probes, and then the testing signal is transmitted back to the tester through the other one of the probes and the other one of the inductive elements;
   wherein the inductive elements are provided on the base board, or on the probe base, or in the probe base.

2. The high-frequency cantilever type probe card of claim 1, wherein the base board has a first side toward the tester and a second side toward the DUT, and the inductive elements are provided on the first side of the base board.

3. The high-frequency cantilever type probe card of claim 1, wherein the base board has a first side toward the tester and a second side toward the DUT, and the inductive elements are provided on the second side of the base board.

4. The high-frequency cantilever type probe card of claim 1, wherein the inductive elements are chokes, coils, a winding, or beads.

5. The high-frequency cantilever type probe card of claim 1, wherein the capacitor is provided on the base board, or on the probe base, or in the probe base.

6. The high-frequency cantilever type probe card of claim 1, further comprising a signal transmission device, which is electrically connected to the opposite ends of the capacitor and the probes respectively.

7. The high-frequency cantilever type probe card of claim 6, wherein the signal transmission device is a flexible printed circuit board.

8. The high-frequency cantilever type probe card of claim 6, wherein a portion of the signal transmission device and the capacitor are embedded in the probe base.

9. The high-frequency cantilever type probe card of claim 5, wherein the signal transmission device has a portion attached to the probe base, and the capacitor is connected to the portion of the transmission device.

10. The high-frequency cantilever type probe card of claim 6, wherein the signal transmission device has a portion attached to the base board, and the capacitor is connected to the portion of the transmission device.

11. The high-frequency cantilever type probe card of claim 6, wherein the inductive elements are provided on a portion of the signal transmission device, and the portion of the signal transmission device is attached to the base board; the base board has a first side toward the tester and a second side toward the DUT, and the inductive elements are provided on the first side of the base board.

12. The high-frequency cantilever type probe card of claim 6, wherein the inductive elements are provided on a portion of the signal transmission device, and the portion of the signal transmission device is attached to the base board; the base board has a first side toward the tester and a second side toward the DUT, and the inductive elements are provided on the second side of the base board.

13. The high-frequency cantilever type probe card of claim 6, wherein a portion of the signal transmission device and the inductive elements are embedded in the probe base.

14. The high-frequency cantilever type probe card of claim 6, wherein the inductive elements are chokes, coils, a winding, or beads.

* * * * *